United States Patent
Paek et al.

(10) Patent No.: US 9,406,732 B2
(45) Date of Patent: Aug. 2, 2016

(54) ORGANIC LIGHT EMITTING DIODE DISPLAY DEVICE AND FABRICATING METHOD THEREOF

(71) Applicant: LG Display Co., Ltd., Seoul (KR)

(72) Inventors: Seung Han Paek, Bucheon-si (KR); Hyo Dae Bae, Paju-si (KR); Young Mu Oh, Seoul (KR); Jeong won Lee, Goyang-si (KR); Heon Il Song, Paju-si (KR); Jong hoon Yeo, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/582,822

(22) Filed: Dec. 24, 2014

(65) Prior Publication Data
US 2016/0005800 A1    Jan. 7, 2016

(30) Foreign Application Priority Data

Jul. 3, 2014    (KR) .................... 10-2014-0083049

(51) Int. Cl.
*H01L 27/32* (2006.01)
*H01L 51/52* (2006.01)

(52) U.S. Cl.
CPC ........ *H01L 27/3246* (2013.01); *H01L 51/5218* (2013.01); *H01L 51/5221* (2013.01); *H01L 2251/303* (2013.01); *H01L 2251/5315* (2013.01); *H01L 2251/558* (2013.01)

(58) Field of Classification Search
CPC ............ H01L 27/3246; H01L 51/5221; H01L 2251/5315; H01L 2251/303; H01L 2251/558
See application file for complete search history.

(56) References Cited

U.S. PATENT DOCUMENTS

| | | | | |
|---|---|---|---|---|
| 6,614,174 B1 * | 9/2003 | Urabe | ................. | H01L 27/3246 313/504 |
| 8,729,533 B2 * | 5/2014 | Kim | ................... | H01L 51/5221 257/40 |
| 2007/0098879 A1 * | 5/2007 | Makiura | ............. | H01L 51/5088 427/66 |
| 2012/0267676 A1 | 10/2012 | Satake | | |

FOREIGN PATENT DOCUMENTS

| | | |
|---|---|---|
| JP | 2005-227519 A | 8/2005 |
| KR | 10-0939927 B1 | 2/2010 |

* cited by examiner

*Primary Examiner* — William Coleman
(74) *Attorney, Agent, or Firm* — Birch, Stewart, Kolasch & Birch, LLP (57) ABSTRACT

An OLED display device is discussed which can include: a first substrate defined into an emission region and a non-emission region; a first electrode formed on the first substrate; a bank pattern configured to expose a part of the first electrode corresponding to the emission region; an organic emission layer formed on the exposed part of the first electrode corresponding to the emission region; a second electrode which includes a first conductive layer formed on the organic emission layer and a second conductive layer formed on the second conductive layer. The first conductive layer is formed from an alloy of magnesium (Mg) and silver (Ag), and the second conductive layer is formed from silver (Ag). Such an OLED display device allows the second electrode to include the first conductive layer and the second conductive layer. As such, a large-sized display device with low resistance and high transmittance can be realized.

20 Claims, 6 Drawing Sheets

ORGANIC LIGHT EMITTING DIODE DISPLAY DEVICE AND FABRICATING METHOD THEREOF

The present application claims priority under 35 U.S.C. §119(a) of Korean Patent Application No. 10-2014-0083049 filed on Jul. 3, 2014 which is hereby incorporated by reference in its entirety.

BACKGROUND OF THE INVENTION

1. Field of the Disclosure

The present application relates to an organic light emitting diode (OLED) display device and a fabricating method thereof. More particularly, the present application relates to an OLED display device adapted to enhance transmittance and yield, and to a method of fabricating the same.

2. Description of the Related Art

Recently, a variety of flat panel display devices with reduced weight and volume corresponding to disadvantages of cathode ray tube (CRT) are being developed. The flat panel display devices include liquid crystal display (LCD) devices, field emission display (FED) devices, plasma display panels (PDPs), electroluminescence (EL) devices and so on.

The electroluminescence devices are classified into an inorganic light emitting diode display device and an organic light emitting diode (OLED) display device on the basis of the formation material of an emission layer. Such electroluminescence devices have advantageous features such as high response time, high light emission efficiency, high brightness and wide viewing angle because of using self-illuminating elements.

An active matrix type OLED (AMOLED) display device controls a current flowing through an organic light emitting element using a thin film transistor, in order to display an image. Such an OLED display device can display an image in one of a top emission mode and a bottom emission mode which are based on structures of the organic light emitting element including a first electrode, a second electrode and an organic emission layer.

The bottom emission mode allows visible light emitted from the organic emission layer to be output in a downward direction of a substrate provided with the thin film transistor. On the contrary, the top emission mode forces visible light emitted from an organic emission layer to be output in an upward direction of a substrate provided with the thin film transistor. Such a bottom emission mode OLED display device can secure stability and a large process margin. However, the bottom emission mode OLED display device must be limited in aperture ratio. Due to this, the bottom emission mode OLED display device cannot be applied to high definition appliances. In view of this point, the top emission mode OLED display device with a high aperture ratio and high definition is being actively researched.

The top emission mode OLED display device can be used as a transparent display device which allows objects and/or images at its rear side opposite to a user. In detail, objects and/or images at the rear of the OLED display device are viewed by the user through the OLED display device in a switch-off state. In a switch-on state, images realized by the OLED display device can be viewed by the user.

In a transparent OLED display device of the top emission mode according to the related art, the second electrode has low transmittance. For example, transmittance of the second electrode is in a range of about 40%-50%. This transmittance value is measured from a small-sized mobile display device.

A large-sized display device increases wirings as its area is enlarged. Due to this, the large-sized display device should have a higher resistance compared to the small-sized display device. In order to lower the resistance of the large-sized display device, the second electrode can be formed thicker. In this case, transmittance of the second electrode should be lowered. As such, emission efficiency of the large-sized display device should also deteriorate.

Also, a second electrode including magnesium (Mg) is used in the top emission mode OLED display device. Such a second electrode including magnesium (Mg) can cause a short circuit in an organic light emitting element due to foreign materials. In this case, a repair process, which makes a non-emission pixel to properly emit light, should be performed for the defected organic light emitting element. However, it is difficult to apply the repair process to the top emission mode OLED display device, because magnesium (Mg) is rapidly oxidized.

BRIEF SUMMARY OF THE INVENTION

Accordingly, embodiments of the present invention are directed to an OLED display device that substantially obviates one or more of problems due to the limitations and disadvantages of the related art, and to a method or fabricating the same.

The embodiments are to provide an OLED display device and a fabricating method thereof which are adapted to realize a large-sized panel with low resistance and high transmittance by forming a second electrode in a double-layer structure with first and second conductive layers.

The embodiments are to provide an OLED display device which is adapted to prevent an electrical connection between a first electrode and a second electrode by forming an oxide layer in a region where the first and second electrodes are positioned close to each other.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to a general aspect of the present embodiments for solving the above-mentioned limitations associated with the related art, an OLED display device includes: a first substrate defined into an emission region and a non-emission region; a first electrode formed on the first substrate; a bank pattern configured to expose a part of the first electrode opposite to the emission region; an organic emission layer formed on the exposed portion of the first electrode corresponding to the emission region; a second electrode which includes a first conductive layer formed on the organic emission layer and a second conductive layer formed on the second conductive layer, wherein the first conductive layer is formed from an alloy of magnesium (Mg) and silver (Ag), and the second conductive layer is formed from silver (Ag).

A fabricating method of an OLED display device according to another general aspect of the present embodiments includes: forming a first electrode on a first substrate which is defined into an emission region and a non-emission region; forming a bank pattern configured to expose a part of the first electrode opposite to the emission region; forming an organic emission layer on the exposed portion of the first electrode within the emission region; and forming a second electrode which includes a first conductive layer formed on the entire surface of the first substrate provided with the organic emission layer and a second conductive layer formed on the first conductive layer, wherein the first conductive layer is formed from an alloy of magnesium (Mg) and silver (Ag), and the second conductive layer is formed from silver (Ag).

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE EMBODIMENTS

Reference will now be made in detail to embodiments of the present invention, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

Figure 1:
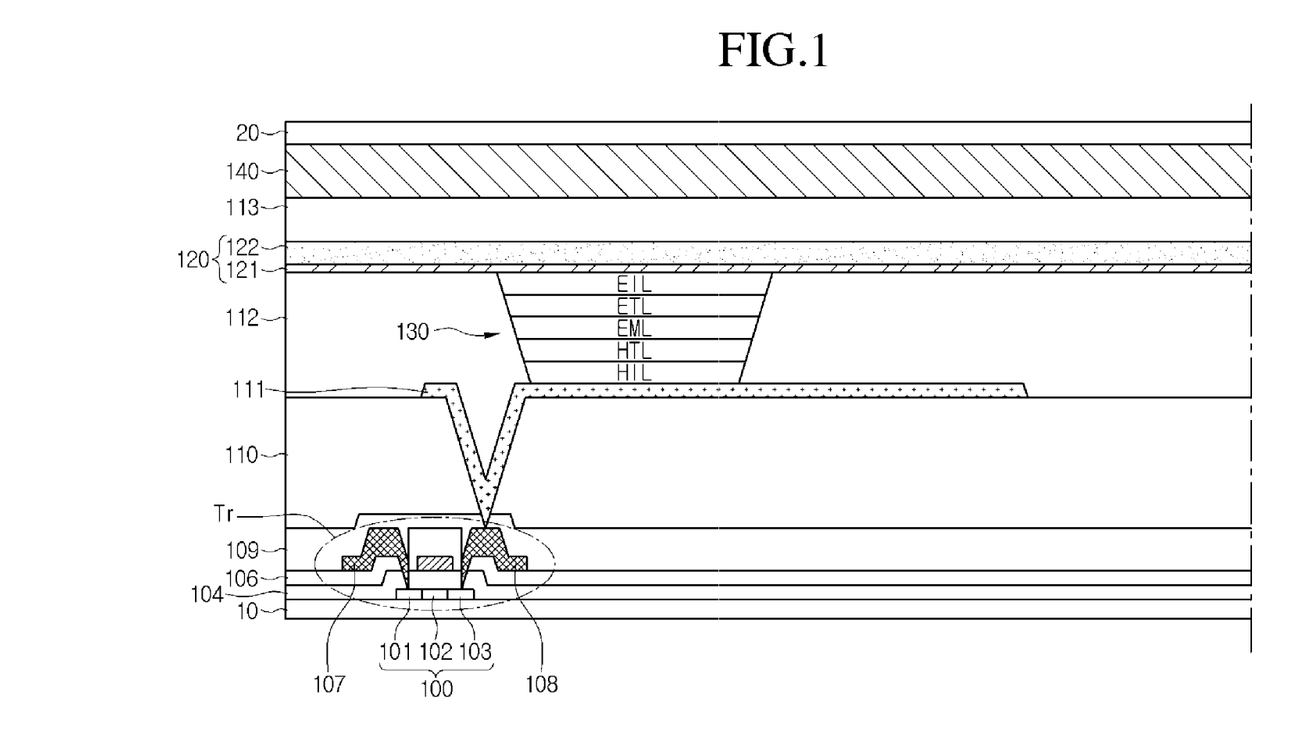
FIG. 1 is a cross-sectional view showing an OLED display device according to a first embodiment of the present invention.

FIG. 1 is a cross-sectional view showing an OLED display device according to a first embodiment of the present disclosure. Referring to FIG. 1, an OLED display device according to a first embodiment of the present disclosure includes: a first substrate 10 defined into an emission region and a non-emission region; a thin film transistor Tr and an organic light emitting element 111, 120 and 130 sequentially formed on the first substrate 10; and a second substrate 20 disposed opposite to the first substrate 10. The thin film transistor Tr includes a semiconductor layer 100, a gate insulation film 104, a gate electrode 105, a source electrode 107 and a drain electrode 108. The organic light emitting element 111, 120 and 130 being in contact with the thin film transistor Tr includes a first electrode 111, a second electrode 120 formed opposite to the first electrode 111 and in a double-layered structure, and an organic emission layer 130 formed between the first electrode 111 and the second electrode 120.

The semiconductor layer 100 is formed on the first substrate 10. Also, the semiconductor layer 100 includes a source region 101, a channel region 102 and a drain region 103. On the other hand, a buffer layer can be formed on the entire surface of the first substrate 10 before the formation of the semiconductor layer 100.

The gate insulation film 104 is formed on the entire surface of the first substrate 10 provided with the semiconductor layer 100. The gate electrode 105 is formed on the gate insulation film 105 opposite to the semiconductor layer 100. Also, the gate electrode 105 can be formed from one selected from a material group which includes copper (Cu), silver (Ag), aluminum (Al), chromium (Cr), titanium (Ti), tantalum (Ta) and alloys thereof. Although the gate electrode is formed in a single metal layer as shown in the drawing, the gate electrode 105 can be formed by stacking at least two metal layers as needed.

An interlayer insulation film 106 is formed on the entire surface of the first substrate 10 provided with the gate electrode 105. Also, contact holes exposing the source region 101 and the drain region 101 and the drain region 103 are formed in the interlayer insulation film 106 and the gate insulation film 104.

Thereafter, the source electrode 107 and the drain electrode 108 are formed on the interlayer insulation film 106 provided with the contact holes. The source electrode 107 and the drain electrode 108 are connected to the source region 101 and the drain region 103 of the semiconductor layer 100 through the contact holes. Such source and drain electrodes 107 and 108 can be formed from one selected from a material group which includes copper (Cu), silver (Ag), aluminum (Al), chromium (Cr), titanium (Ti), tantalum (Ta) and alloys thereof. Although the source and drain electrodes 107 and 108 are formed in a single metal layer as shown in the drawing, they are not limited to this. Alternatively, the source and drain electrodes 107 and 108 can be formed by stacking at least two metal layers as needed.

In this way, the thin film transistor Tr is formed on the first substrate 10. Although it is shown in the drawing that a single thin film transistor Tr is formed on the first substrate 10, a plurality of thin film transistors is formed on the first substrate 10 in such a manner as to be separate from one another.

Afterward, a passivation film 109 is formed on the entire surface of the first substrate 10 provided with the thin film transistor Tr. Also, a planarization film 110 is formed on the entire surface of the above-mentioned first substrate 10 (i.e., the passivation film 109). Then, a contact hole exposing the drain electrode 108 is formed in the planarization film 110 and the passivation film 109.

The first electrode 111 of the organic light emitting element is formed on the planarization film 110 provided with the contact hole. The first electrode 111 is connected to the drain electrode 108 through the contact hole. Also, the first electrode 111 can be an anode electrode. Such a first electrode 111 can be formed from a transparent conductive material with a relatively high word function value.

The first electrode 111 is not limited to the shape shown in the drawing. Alternatively, the first electrode 111 can be formed in a multi-layered structure.

For example, the first electrode 111 can be formed in a triple-layered structure with sequentially stacked first through third layers. In this case, the first layer and the third layer can be formed from a transparent conductive material. The transparent conductive material can be one of indium-tin-oxide ITO and indium-zinc-oxide IZO. The second layer can be a reflective layer. Such a second layer can be formed from a metal or a metal alloy. For example, the second layer can be formed from silver (Ag) or a metal alloy including silver (Ag). As such, the organic light emitting element 111, 120 and 130 enables light emitted from the organic emission layer 130 to be reflected toward the second electrode 120 by the first electrode 111. In accordance therewith, a top emission type OLED display device configured to emit light in an upward direction can be implemented.

A bank pattern 112 can be formed on the planarization film 110 provided with the first electrode 111. An opening can be formed in the bank pattern 112. The opening exposes a part of the first electrode 111 in an emission region.

The organic emission layer 130 can be formed on the first electrode 111 which is exposed in the emission region through the opening of the bank pattern 112. In order to enhance emission efficiency, the organic emission layer 130 can be configured with a plurality of layers. For example, the organic emission layer 130 can include a hole injection layer HIL, a hole transport layer HTL, an emission material layer EML, an electron transport layer ETL and an electron injection layer EIL, as shown in the drawing. However, the organic emission layer 130 is not limited to the structure shown in the drawing. Alternatively, the organic emission layer 130 can be configured with a single layer formed from an emission material. In this case, in order to secure interfacial stability between the first electrode 111 and the organic emission layer 130, a buffer layer can further be formed between the first electrode 111 and the organic emission layer 130.

The second electrode 120 being opposite to the first electrode 111 can be formed on the entire surface of the first substrate 10 provided with the organic emission layer 130 and the bank pattern 112.

The second electrode of the OLED display device according to the related art has low transmittance. If the second electrode of low transmittance is applied to a large-sized display device, the enlarged area increases wirings. As such, the resistance of the second electrode increases. In order to lower the resistance, the second electrode must become thinner.

The thickness increment of the second electrode deteriorates transmittance. Due to this, it is difficult to increase the thickness of the second electrode above a critical value. In view of this point, it is necessary for a second electrode which has low resistance and secures sufficient transmittance.

To address this matter, the second electrode 120 can be formed in a double-layered structure with a first conductive layer 121 and a second conductive layer 122 stacked on the first conductive layer 121. The first conductive layer 121 can be formed from an alloy of magnesium (Mg) and silver (Ag). The second conductive layer 122 can be formed from silver (Ag).

The thickness of the first conductive layer 121 can be in a range of 2 Å through 200 Å. Preferably, the first conductive layer is formed to have a thickness in the range of about 2 Å through 50 Å. If the first conductive layer 121 is formed to have a thickness that is no more than 2 Å, it is unnecessary to form the second conductive layer 122. On the other hand, when the first conductive layer 121 is formed to have a thickness that is not less than 200 Å, the transmittance of the second electrode 120 can deteriorate.

The thickness of the second conductive layer 122 can be in a range of about 50 Å through 300 Å. Preferably, the second conductive layer 122 is formed to have a thickness in the range of about 50 Å through 200 Å. If the second conductive layer 122 is formed to have a thickness that is no more than 50 Å, it may be difficult to inject electrons at a low voltage. Also, it is not preferable to form the second conductive layer 122 to have a thickness above 300 Å, because the transmittance largely deteriorates.

Also, the second conductive layer 122 can be formed thicker than the first conductive layer 121. As such, oxidation of the first conductive layer 121 can be prevented.

A sealing layer 113 can be formed on the entire surface of the first substrate 10 provided with the second electrode 120. The sealing layer 113 prevents the generation of a total reflection in an upper surface of the second electrode 120. As such, the emission efficiency of the organic light emitting element 111, 120 and 130 can be enhanced. To this end, the sealing layer 113 can be formed from one of an organic material, an inorganic material and a metal oxide. Preferably, the sealing layer 113 is formed from an organic material.

The second substrate 20 is combined with the first substrate 10, on which the sealing layer 113 is formed, using an adhesive. The adhesive can be formed from one of a photo curable resin and a thermally curable resin. Also, one of air, nitrogen and the adhesive can be filled into a space between the first and second substrates 10 and 20 which are combined with each other.

In this manner, the OLED display device of the present disclosure allows the second electrode 120 to be configured with the first conductive layer 121, which is formed from an alloy of magnesium (Mg) and silver (Ag), and the second conductive layer which is formed from silver (Ag). As such, the second electrode can not only have low resistance but also secure high transmittance even though it is applied to a large-sized display device.

Figure 2:
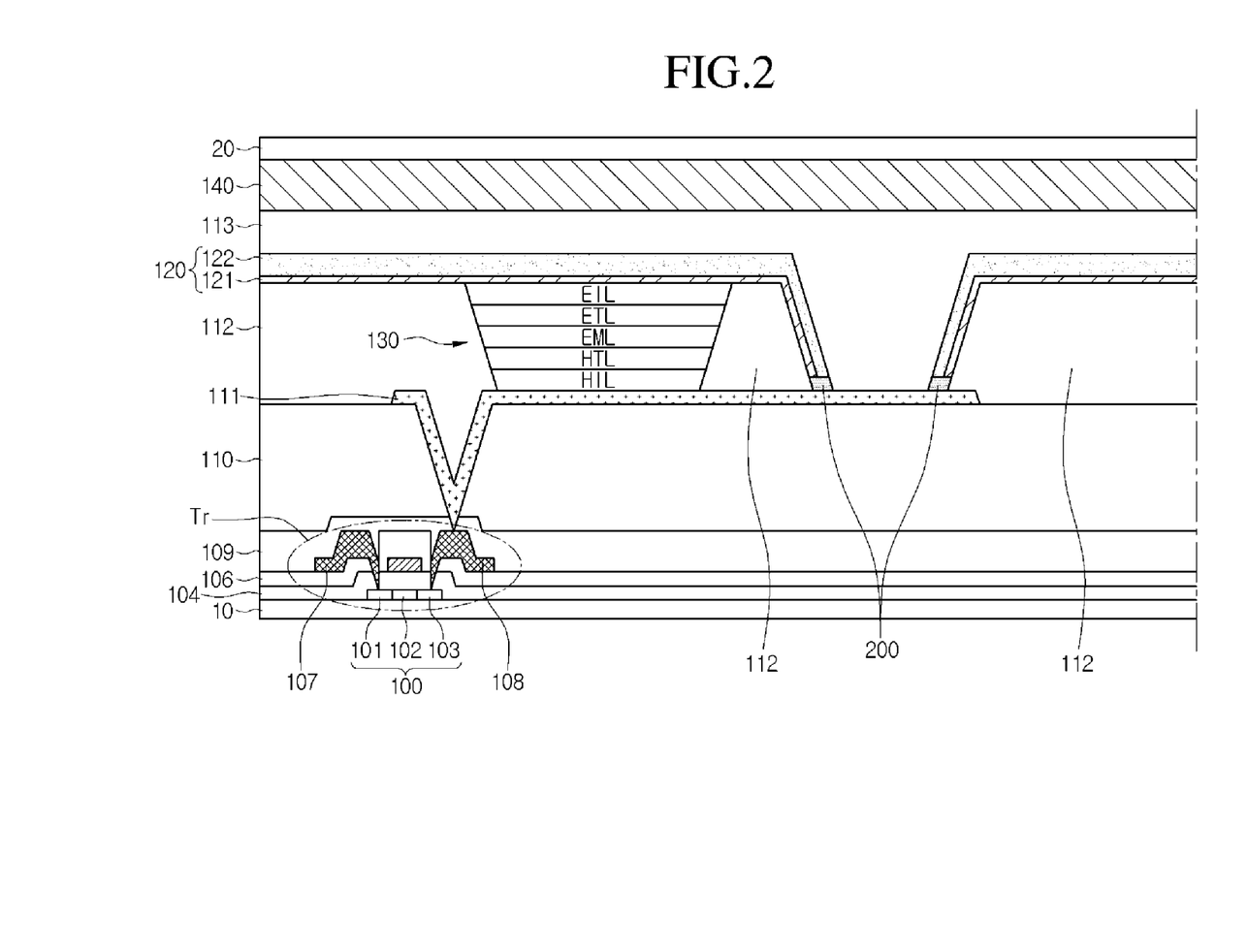
FIG. 2 is a cross-sectional view showing an OLED display device according to a second embodiment of the present invention.

Subsequently, an OLED display device according to a second embodiment of the present disclosure will be described with reference to FIG. 2. FIG. 2 is a cross-sectional view showing an OLED display device according to a second embodiment of the present disclosure. The OLED display device of the second embodiment can include the same components as that of the previous or other embodiment. As such, components of the second embodiment having the same function and shape as those of the previous or other embodiment will be referred to by the same reference numbers and names. Also, the description of the second embodiment overlapping with the previous or other embodiment will be brief or omitted.

Referring to FIG. 2, an OLED display device according to a second embodiment of the present disclosure includes: a thin film transistor Tr and an organic light emitting element 111, 120 and 130 sequentially formed on a first substrate 10; a sealing layer 113 formed on the entire surface of the first substrate 10 provided with the organic light emitting element 111, 120 and 130; and a second substrate 20 disposed over the sealing layer 113. The organic light emitting element 111, 120 and 130 includes a first electrode being in contact with the thin film transistor Tr, an organic emission layer 130 formed on the first electrode 111, and a second electrode 120 formed on the organic emission layer 130 in a double layered structure. The sealing layer 113 is formed on the entire surface of the first substrate 10 provided with the second electrode 120, and the second substrate 20 is disposed over the sealing layer 113.

The thin film transistor Tr includes a semiconductor layer 100, a gate insulation film 104, a gate electrode 105, a source electrode 107 and a drain electrode 108. The organic light emitting element 111, 120 and 130 being in contact with the thin film transistor Tr includes a first electrode 111, a second electrode 120 formed opposite to the first electrode 111 and in a double-layered structure, and an organic emission layer 130 formed between the first electrode 111 and the second electrode 120.

The thin film transistor Tr is connected to the first electrode 111 through a contact hole which is formed in a passivation film 109 and a planarization film 110. The passivation film 109 and the planarization film 110 are sequentially formed on the entire surface of the first substrate 10 provided with the thin film transistor Tr.

The first electrode 111 can be an anode electrode. Such a first electrode 111 can be formed from a transparent conductive material with a relatively high word function value. The transparent conductive material can be one of indium-tin-oxide ITO and indium-zinc-oxide IZO.

The first electrode 111 is not limited to the shape shown in the drawing. Alternatively, the first electrode 111 can be formed in a multi-layered structure.

For example, the first electrode 111 can be formed in a triple-layered structure with sequentially stacked first through third layers. In this case, the first layer and the third layer can be formed from a transparent conductive material. The transparent conductive material can be one of indium-tin-oxide ITO and indium-zinc-oxide IZO. The second layer can be a reflective layer. Such a second layer can be formed from a metal or a metal alloy. For example, the second layer can be formed from silver (Ag) or a metal alloy including silver (Ag). As such, the organic light emitting element 111, 120 and 130 enables light emitted from the organic emission layer 130 to be reflected toward the second electrode 120 by the first electrode 111. In accordance therewith, a top emission type OLED display device configured to emit light in an upward direction can be implemented.

A bank pattern 112 can be formed on the planarization film 110 provided with the first electrode 111. An opening can be formed in the bank pattern 112. The opening exposes the first electrode 111 in an emission region.

The organic emission layer 130 can be formed on the first electrode 111 which is exposed through the opening of the bank pattern 112 in the emission region. In order to enhance emission efficiency, the organic emission layer 130 can be configured with a plurality of layers. For example, the organic emission layer 130 can include a hole injection layer HIL, a hole transport layer HTL, an emission material layer EML, an electron transport layer ETL and an electron injection layer EIL, as shown in the drawing. However, the organic emission layer 130 is not limited to the structure shown in the drawing. Alternatively, the organic emission layer 130 can be configured with a single layer formed from an emission material.

However, the bank pattern 112 can be formed in such a manner as to expose a part of the upper surface of the first electrode 111 within the non-emission region due to foreign materials. In detail, the bank pattern 112 cannot be formed on the first electrode 111 within the non-emission region. Due to this, a part of the upper surface of the first electrode 111 within the non-emission region can be exposed.

Thereafter, the second electrode 120 being opposite to the first electrode 111 can be formed on the entire surface of the first substrate 10 provided with the organic emission layer 130 and the bank pattern 112. Such a second electrode can be a cathode electrode. Also, the second electrode 120 can be formed in a double-layered structure which includes a first conductive layer 121 and a second conductive layer 122 formed on the first conductive layer 121.

The first conductive layer 121 can be formed from an alloy of magnesium (Mg) and silver (Ag). The second conductive layer 122 can be formed from silver (Ag).

The thickness of the first conductive layer 121 can be in a range of 2 Å through 200 Å. Preferably, the first conductive layer is formed to have a thickness in the range of about 2 Å through 50 Å. If the thickness of the first conductive layer 121 is no more than 2 Å, it is unnecessary to form the second conductive layer 122. On the other hand, when the first conductive layer 121 is formed to have a thickness that is not less than 200 Å, the transmittance of the second electrode 120 can deteriorate.

The thickness of the second conductive layer 122 can be in a range of about 50 Å through 300 Å. Preferably, the second conductive layer 122 is formed to have a thickness in the range of about 50 Å through 200 Å. If the second conductive layer 122 is formed to have a thickness that is no more than 50 Å, it is difficult to inject electrons at a low voltage. Also, it is not preferable to form the second conductive layer 122 to have a thickness above 300 Å, because the transmittance largely deteriorates.

The first conductive layer 121 of the second electrode 120 can be formed in such a manner as to overlap with the upper surface of the first electrode 111. The second conductive layer 122 can be formed in such a manner as to overlap with the upper surface of the first electrode 111. Also, the second conductive layer can be formed in such as to surround the first conductive layer 121.

In this case, a short circuit can be generated in the organic light emitting element 111, 120 and 130 because the first electrode 111 is electrically connected to the second electrode 120. As such, it is necessary to perform a repair process for electrically separating the first and second electrodes 111 and 120 from each other. The repair process insulates the defected region of the organic light emitting element and forces the defected region to become a dark dot. In accordance therewith, a non-emission pixel can normally emit light.

Such a repair process is being actively used in the bottom emission mode OLED display device. However, in the top emission mode OLED display device, oxidation can be generated throughout the second electrode. As such, the second electrode cannot be used as an electrode of the organic light emitting element. Due to this, it is difficult to apply the repair process to the top emission mode OLED display device.

In order to prevent an electrical short phenomenon in a close region between the first electrode 111 and the second electrode 120, the OLED display device of the present disclosure allows an oxide layer 200 to be formed between the first conductive layer 121 of the second electrode 120 and the first electrode 111 within the non-emission region. Also, the oxide layer 200 can be formed between the first electrode 111 and the second conductive layer 122 of the second electrode 120.

Such an oxide layer 200 can be formed from silver oxide (AgxO). For example, the oxide layer 200 can be formed from one of (Ag2O) and (AgO). In other words, the oxide layer 200 can be interposed between apart of the upper surface of the first electrode 111 and the second electrode 120 which are exposed by a hole of the bank pattern 112 formed in the non-emission region.

In accordance therewith, an electrical contact between the first and second electrodes 111 and 120 and/or the generation of an electrical short phenomenon between the first and second electrodes 111 and 120 due to a foreign material can be prevented. The formation region of the oxide layer 200 is not limited to the region shown in the drawing. In other words, the oxide layer 200 can be formed on the side surface of the second conductive layer 122. Also, the oxide layer 200 can be formed between the foreign material and the second electrode 120.

The alloy of magnesium (Mg) and silver (Ag) used to form the first conductive layer 121 is actively oxidized due to magnesium (Mg). In order to prevent the oxidation of the first conductive layer 121, the OLED display device of the present disclosure allows the second conductive layer 122 protecting the first conductive layer 121 to be formed. As such, it can be prevented that the first conductive layer 121 is entirely oxidized when the oxide layer is formed.

A sealing layer 113 can be formed on the entire surface of the first substrate 10 provided with the second electrode 120. The sealing layer 113 can be formed from one of an organic material, an inorganic material and a metal oxide. Preferably, the sealing layer 113 is formed from an organic material.

The second substrate 20 is combined with the first substrate 10, on which the sealing layer 113 is formed, using an adhesive. Also, one of a moisture absorbent, air, nitrogen and the adhesive can be filled into a space between the first and second substrates 10 and 20 which are combined with each other.

The OLED display device of the present disclosure allows the oxide layer 200 to be formed in a close region between the first electrode 111 and the second electrode 120. As such, an electrical connection of the first electrode 111 and the second electrode 120 can be prevented.

Also, the second conductive layer 122 of the second electrode 120 is formed in such a manner as to surround (or encompass) the first conductive layer 121 of the second electrode 120. In accordance therewith, the entire oxidation of the first conductive layer 121 can be prevented, and the first conductive layer 121 can be insulated. Therefore, the first conductive layer 121 can be normally used as an electrode of the organic light emitting element.

Next, a fabricating method of the OLED display device according to a third embodiment of the present disclosure will be described with reference to FIGS. 3A through 3D. FIGS. 3A through 3D are cross-sectional views illustrating a method of fabricating an OLED display device according to a third embodiment of the present disclosure. The OLED display device fabricated through the method of the third embodiment can include the same components as that of the previous or other embodiments. As such, components of the third embodiment having the same function and shape as those of the previous or other embodiments will be referred to by the same reference numbers and names. Also, the description of the third embodiment overlapping with the previous or other embodiments will be brief or omitted.

Figure 3A:
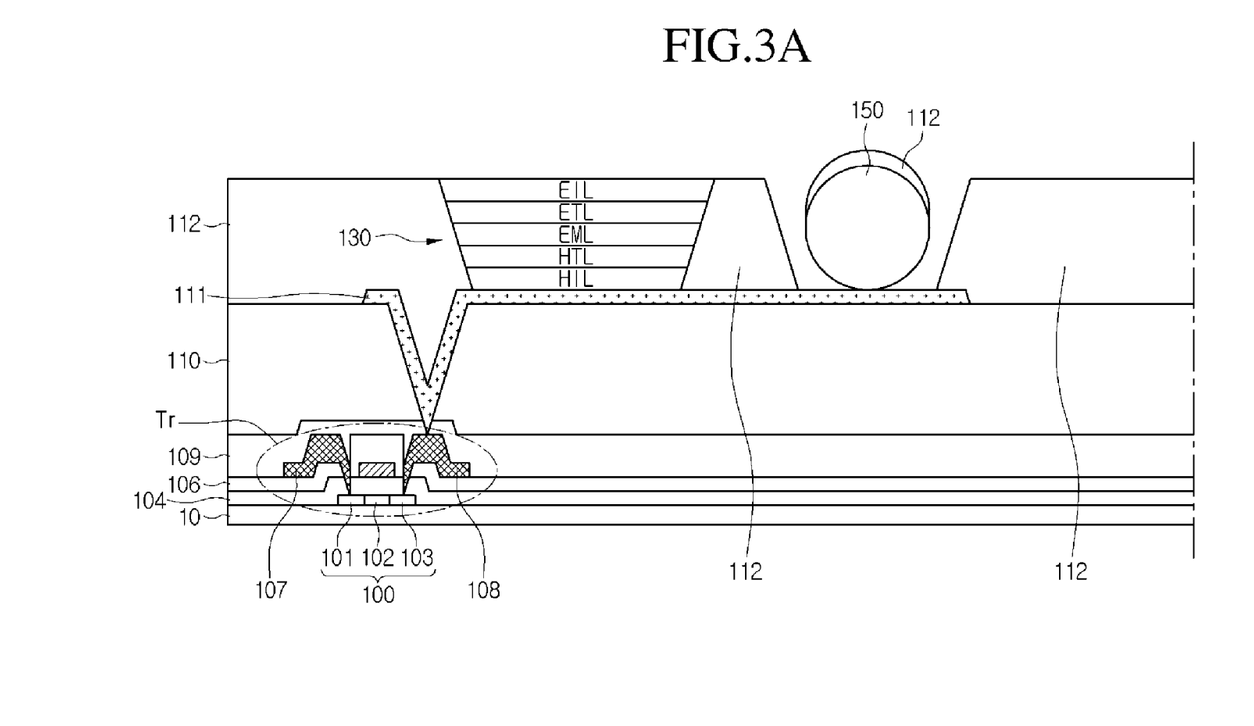
FIGS. 3A through 3D are cross-sectional views illustrating a method of fabricating an OLED display device according to a third embodiment of the present invention.

Referring to FIG. 3A, a semiconductor layer 100 is formed on a first substrate 10 which is defined into an emission region and a non-emission region. The semiconductor layer 100 can be prepared by forming a semiconductor material such as amorphous silicon on the first substrate 10 and then pattering the semiconductor material through a first photoresist process. Also, a gate insulation film 104 is formed on the entire surface of the first substrate 10 provided with the semiconductor layer 100.

A gate electrode 105 is formed on the gate insulation film 104. The gate electrode 105 can be formed by forming a gate metal layer on the gate insulation film 104 and then patterning the gate metal layer through a second photoresist process.

The gate metal layer can be formed from a variety of metal materials. For example, the gate metal layer can be formed from one selected from a metal group which includes copper (Cu), silver (Ag), aluminum (Al), chromium (Cr), titanium (Ti), tantalum (Ta) and alloys thereof. Although the gate electrode 105 is formed in a single layer as shown in the drawing, it is not limited to this. In other words, the gate electrode 105 can be formed by stacking at least two metal layers, as needed.

A source region 101 and a drain 103 are formed in the semiconductor layer 100 by doping high density impurity ions into the semiconductor layer 100 using the gate electrode 105 as a mask. A reference number inserted in the drawings indicates a channel region which is not described in this paragraph.

Thereafter, an interlayer insulation film 106 is formed on the entire surface of the first substrate 10 provided with the gate electrode 105. Also, primary contact holes exposing the source region 101 and the drain region 103 of the semiconductor layer 100 are formed by partially removing the interlayer insulation film 106 and the gate insulation film 104 through the photoresist process.

A source/drain electrode material layer is formed on the entire surface of the first substrate 10 which includes the interlayer insulation film 107 with the primary contact holes. Then, the source/drain electrode material layer is patterned through a third photoresist process. In accordance therewith, a source electrode 107 and a drain electrode 108 connected to the source region 101 and the drain region 103 are formed on the interlayer insulation film 106.

The source/drain electrode material layer can be formed from a variety of metal materials. For example, the source/drain electrode material layer can be formed from one selected from a metal group which includes copper (Cu), silver (Ag), aluminum (Al), chromium (Cr), titanium (Ti), tantalum Ta and alloys thereof. Although the source electrode 107 and the drain electrode 108 are formed in a single layer as shown in the drawing, it is not limited to this. In other words, the source electrode 107 and the drain electrode 108 can be formed by stacking at least two metal layers, as needed. In this manner, a thin film transistor Tr is formed on the first substrate 10.

A passivation film 109 is formed on the entire surface of the first substrate 10 provided with the thin film transistor Tr. Also, a planarization film 110 is formed on the passivation film 109. Moreover, a fourth photoresist process is performed for the planarization film 110 and the passivation film 109. As such, a part of the planarization film 110 is etched, and then a part of the passivation film 109 is etched. In accordance therewith, a secondary contact hole exposing the drain electrode 108 is formed in the planarization film 110 and the passivation film 109.

A first electrode 111 is formed on the planarization film provided with the second contact hole. The first electrode 111 can be prepared by formed a first electrode material layer on the entire surface of the first substrate 10, which includes the planarization film 110 provided with the second contact hole, and then patterning the first electrode material layer through a fifth photoresist process. Also, the first electrode 111 can be formed from one of indium-tin-oxide ITO and indium-zinc-oxide IZO.

The first electrode 111 is not limited to the shape shown in the drawing. Alternatively, the first electrode 111 can be formed in a multi-layered structure.

For example, the first electrode 111 can be formed in a triple-layered structure with sequentially stacked first through third layers. In this case, the first layer and the third layer can be formed from a transparent conductive material. The transparent conductive material can be one of indium-tin-oxide ITO and indium-zinc-oxide IZO. The second layer can be a reflective layer. Such a second layer can be formed from a metal or a metal alloy. For example, the second layer can be formed from silver (Ag) or a metal alloy including silver (Ag).

Afterward, a bank pattern 112 with an opening can be formed on the planarization film 110 provided with the first electrode 111. The opening exposes a part of the first electrode 111 in the emission region. Also, an organic emission layer 130 can be formed on the first electrode 111 which is exposed through the opening of the bank pattern 112 within the emission region.

In order to enhance emission efficiency, the organic emission layer 130 can be configured with a plurality of layers. For example, the organic emission layer 130 can include a hole injection layer HIL, a hole transport layer HTL, an emission material layer EML, an electron transport layer ETL and an electron injection layer EIL, as shown in the drawing. However, the organic emission layer 130 is not limited to the structure shown in the drawing. Alternatively, the organic emission layer 130 can be configured with a single layer formed from an emission material.

However, the bank pattern 112 in the non-emission region can be formed in such a manner as to expose a part of the upper surface of the first electrode 111 due to a foreign material 150. In detail, the bank pattern 112 cannot be formed on the first electrode 111 within the non-emission region. Due to this, a part of the upper surface of the first electrode 111 within the non-emission region can be exposed. As such, the bank pattern 112 can also be formed on an upper surface of the foreign material 150.

Figure 3B:
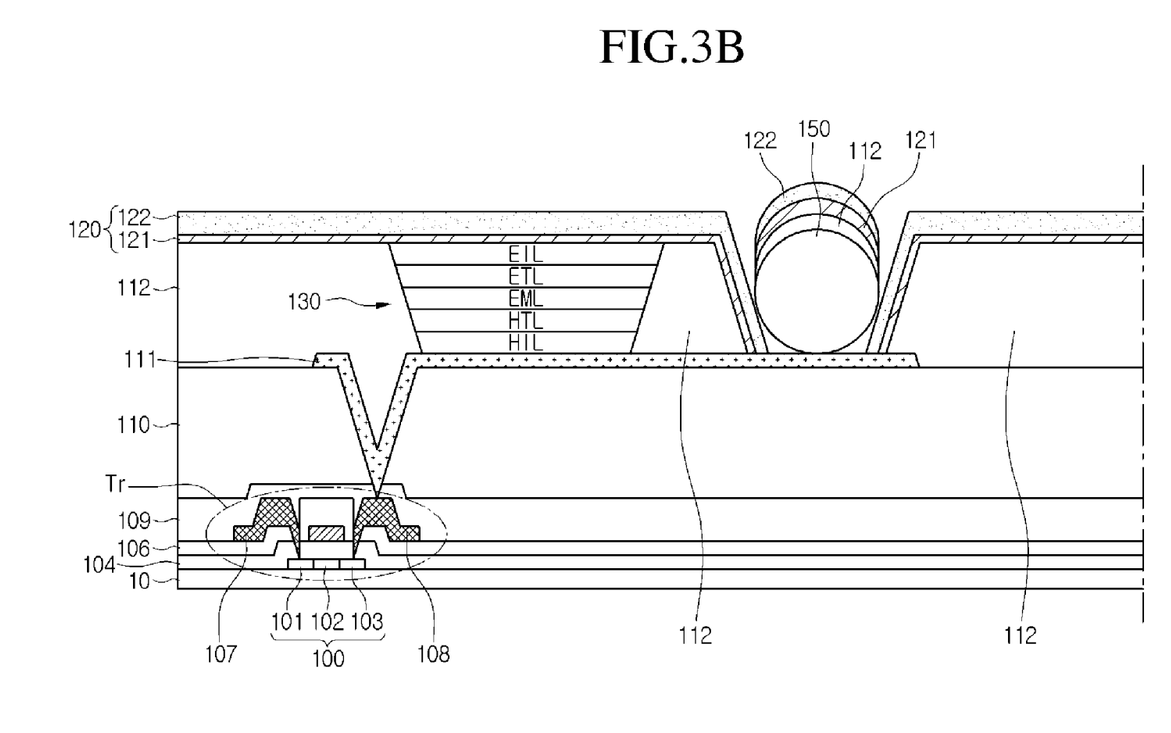

As shown in FIG. 3B, a second electrode 120 is formed on the first substrate 10 which includes the organic emission layer 130 within the emission region and the partially exposed first electrode 111 within the non-emission region. The second electrode 120 can become a cathode electrode. Also, the second electrode 120 can be formed in a double-layered structure which includes a first conductive layer 121 and a second conductive layer 122 formed on the first conductive layer 121. Moreover, the second electrode 120 can be formed on the bank pattern 112 covering the foreign material 150.

The second conductive layer 122 close to an exposed part of the upper surface of the first electrode 111 within the non-emission region can be formed in such a manner as to surround the first conductive layer 121. The first conductive layer 121 and the second conductive layer 122 can be formed in such a manner as to overlap with the upper surface of the first electrode 111. In detail, the first conductive layer 121 of the second electrode 120 can be formed in such a manner as to overlap with the upper surface of the first electrode 111. Also, the second conductive layer 122 of the second electrode 120 can be formed in such a manner as to overlap with the first electrode 111.

The first conductive layer 121 can be formed from an alloy of magnesium (Mg) and silver (Ag). The second conductive layer 122 can be formed from silver (Ag). The thickness of the first conductive layer 121 can be in a range of 2 Å through 200 Å. The thickness of the second conductive layer 122 can be in a range of about 50 Å through 300 Å. In other words, the second conductive layer 122 can be formed thicker than the first conductive layer 121.

If the first electrode 111 and the second electrode 120 are formed closely to each other in the non-emission region, a short circuit can be generated in the organic light emitting element 111, 120 and 130. To address this matter, an oxide layer 200 can be formed between the first electrode 111 and the second electrode 120. In detail, the oxide layer 200 can be interposed between a part of the upper surface of the first electrode 111 and the second electrode 120 within the non-emission region.

Figure 3C:
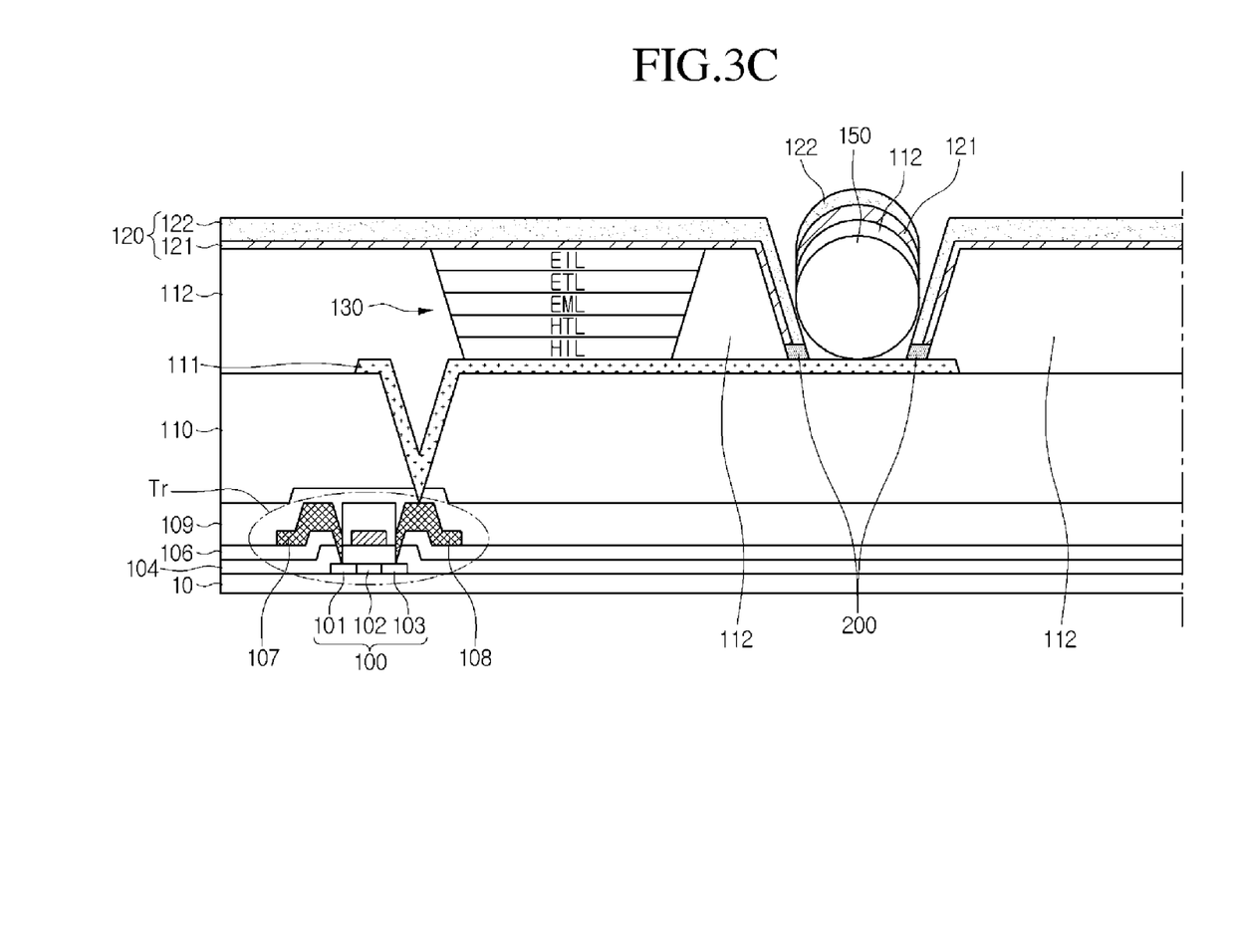

As shown in FIG. 3C, an oxide layer 200 is formed between the first conductive layer 121 and the first electrode 111. The oxide layer 200 can also be formed between the second conductive layer 122 and the first electrode 111. Such an oxide layer 200 can be formed by applying a reverse bias to the first substrate 10 with the second electrode 120 under air, oxygen or ozone atmosphere. Alternatively, the oxide layer 200 can be formed by performing a heat treatment process for the first substrate 10 provided with the second electrode 120 and simultaneously applying a reverse bias to the above-mentioned first substrate 10.

The reverse bias can be a voltage range of about −1V~−30V. In order to prevent damage of the organic material, it is preferable to set the reverse bias to a voltage range of about −1V~−15V.

The oxide layer 200 can be formed from silver oxide (Ag)xO. For example, the oxide layer 200 can be formed from one of (Ag)2O and (Ag)O.

The formation region of the oxide layer 200 is not limited by the drawing. In other words, the oxide layer 200 can also be formed on a side surface of the second conductive layer 122. Furthermore, the oxide layer 200 can be formed between the foreign material 150 and the second electrode 120.

The alloy of magnesium (Mg) and silver (Ag) used to form the first conductive layer 121 is actively oxidized due to magnesium (Mg). In order to prevent the oxidation of the first conductive layer 121, the OLED display device of the present disclosure allows the second conductive layer 122 to be formed in such a manner as to surround the first conductive layer 121. As such, it can be prevented that the first conductive layer 121 is entirely oxidized when the oxide layer is formed. Also, the generation of a short circuit in the organic light emitting element due to contact of the first and second electrodes 111 and 120 can be prevented.

Figure 3D:
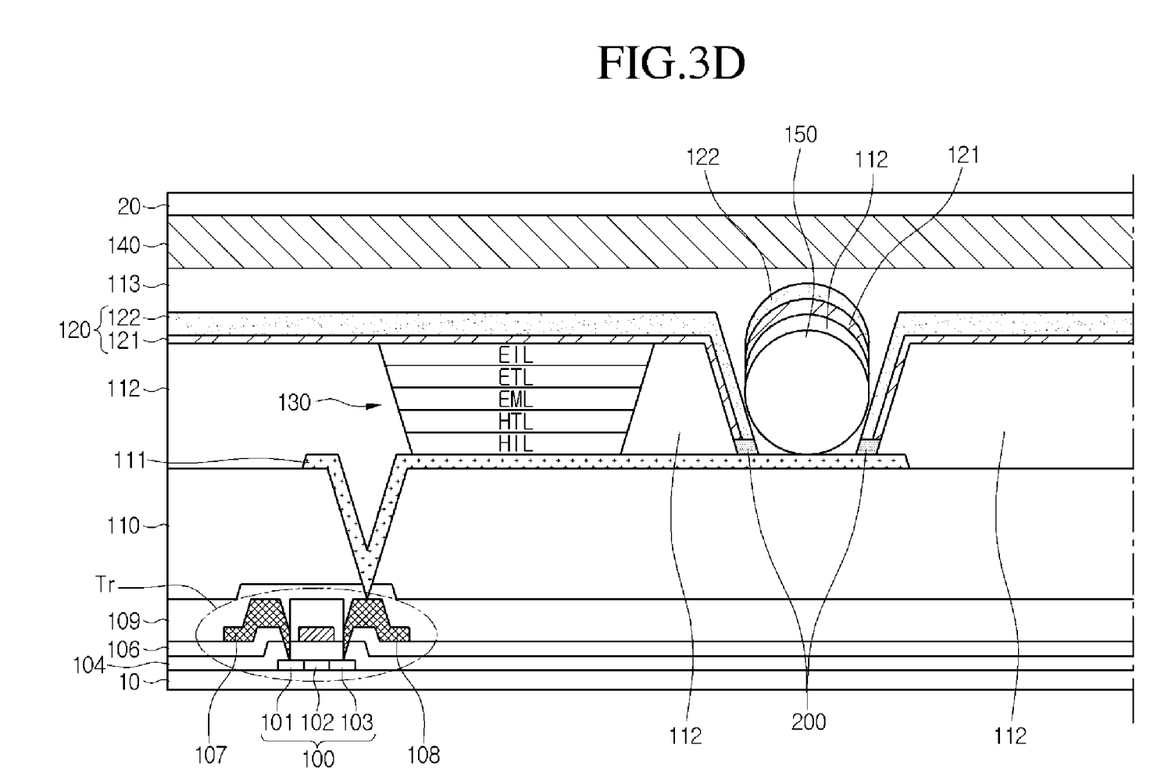

Referring to FIG. 3D, a sealing layer 113 can be formed on the entire surface of the first substrate 10 provided with the second electrode 120. The sealing layer 113 can be formed from one of an organic material, an inorganic material and a metal oxide. Subsequently, the second substrate 20 is combined with the first substrate 10, on which the sealing layer 113 is formed, using an adhesive. Also, one of a moisture absorbent, air, nitrogen and the adhesive can be filled into a space between the first and second substrates 10 and 20 which are combined with each other.

The OLED display device of the present disclosure allows the oxide layer 200 to be formed in a close region between the first electrode 111 and the second electrode 120. As such, an electrical connection of the first electrode 111 and the second electrode 120 can be prevented. In accordance therewith, the generation of a defect (or fault) of the organic light emitting element can be prevented, and yield of the OLED display device can be enhanced.

Also, the second conductive layer 122 of the second electrode 120 is formed in such a manner as to surround (or encompass) the first conductive layer 121 with an active oxidation property. In accordance therewith, the entire oxidation of the first conductive layer 121 at the formation of the oxide layer 200 can be prevented.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents without being limited to the detailed description.

What is claimed is:

1. An organic light emitting diode display device comprising:
   a first substrate defined into an emission region and a non-emission region;
   a first electrode disposed on the first substrate;
   a bank pattern configured to expose a part of the first electrode opposite to the emission region;
   an organic emission layer disposed on the exposed part of the first electrode corresponding to the emission region; and
   a second electrode which includes a first conductive layer formed on the organic emission layer and a second conductive layer on the first conductive layer,
   wherein the first conductive layer includes an alloy of magnesium (Mg) and silver (Ag), and the second conductive layer includes silver (Ag), and
   wherein the bank pattern exposes a part of an upper surface of the first electrode within the non-emission region.

2. The organic light emitting diode display device of claim 1, wherein the first conductive layer and the second conductive layer of the second electrode are disposed on an entire surface of the first substrate.

3. The organic light emitting diode display device of claim 1, wherein the first conductive layer has a thickness in a range of about 2 Å~200 Å.

4. The organic light emitting diode display device of claim 1, wherein the second conductive layer has a thickness in a range of about 50 Å~300 Å.

5. The organic light emitting diode display device of claim 1, wherein the bank pattern is formed on a planarization film provided with the first electrode.

6. The organic light emitting diode display device of claim 1, further comprising an oxide layer disposed between the exposed part of the upper surface of the first electrode and the second electrode.

7. The organic light emitting diode display device of claim 1, wherein the organic emission layer includes a hole injection layer, a hole transport layer, an emission material layer, an electron transport layer and an electron injection layer which are sequentially formed on the first electrode.

8. The organic light emitting diode display device of claim 1, wherein the first electrode includes a reflective layer.

9. The organic light emitting diode display device of claim 6, wherein the first conductive layer overlaps with the first electrode, and the second conductive layer surrounds the first conductive layer and overlaps with the first electrode.

10. The organic light emitting diode display device of claim 9, wherein the oxide layer is disposed in a close region between the exposed part of the first electrode and the first conductive layer and another close region between the exposed part of the first electrode and the second conductive layer within the non-emission region.

11. The organic light emitting diode display device of claim 10, wherein the oxide layer includes silver oxide ($Ag_xO$).

12. A method of fabricating an organic light emitting diode display device, the method comprising:
    forming a first electrode on a first substrate which is defined into an emission region and a non-emission region;
    forming a bank pattern configured to expose a part of the first electrode opposite to the emission region;
    forming an organic emission layer on the exposed part of the first electrode within the emission region; and
    forming a second electrode which includes a first conductive layer formed on an entire surface of the first substrate provided with the organic emission layer and a second conductive layer formed on the first conductive layer,
    wherein the first conductive layer is formed from an alloy of magnesium (Mg) and silver (Ag), and the second conductive layer is formed from silver (Ag),
    wherein the formation of the bank pattern allows a part of an upper surface of the first electrode within the non-emission region to be exposed.

13. The method of claim 12,
    wherein the formation of the second electrode includes forming the first conductive layer in contact with the exposed part of the upper surface of the first electrode within the non-emission region, and forming the second conductive layer to surround the first conductive layer within the first conductive layer and come in contact with the exposed part of the upper surface of the first electrode within the non-emission region.

14. The method of claim 13, wherein the formation of the bank pattern allows the upper surface of the first electrode to be partially exposed due to a foreign material in the non-emission region.

15. The method of claim 13, further comprising:
    forming an oxide layer between the first electrode and the first and second conductive layers within the non-emission region by applying a reverse bias to the first substrate provided with the first and second conductive layers.

16. The method of claim 13, further comprising:
    forming an oxide layer between the first electrode and the first and second conductive layers within the non-emission region by performing a heat treatment for the first substrate provided with the first and second conductive layers and simultaneously applying a reverse bias to the first substrate.

17. The method of claim 13, wherein the oxide layer is formed from silver oxide ($Ag_xO$).

18. The method of claim 15, wherein the reverse bias is set to a voltage range of about −1V through −30V.

19. The method of claim 16, wherein the reverse bias is set to a voltage range of about −1V through −30V.

20. The method of claim 13, wherein the first conductive layer is formed to have a thickness in a range of about 2 Å~200 Å, and the second conductive layer is formed to have a thickness in a range of about 50 Å~300 Å.

* * * * *